United States Patent [19]

Nagasaka et al.

[11] Patent Number: 5,308,686

[45] Date of Patent: May 3, 1994

[54] SUBSTRATE HAVING A MULTIPLE METAL PROTECTED CONDUCTIVE LAYER AND METHOD OF MANUFACTURING THE SAME

[75] Inventors: Takashi Nagasaka, Anjo; Hideki Nakagawara, Towada, both of Japan

[73] Assignee: Nippondenso Co., Ltd., Kariya, Japan

[21] Appl. No.: 802,229

[22] Filed: Dec. 4, 1991

[30] Foreign Application Priority Data

Dec. 28, 1990 [JP] Japan .................................. 2-409363

[51] Int. Cl.$^5$ ............................................. B32B 9/00
[52] U.S. Cl. .................................... 428/209; 428/901; 428/210
[58] Field of Search .................. 428/209, 901, 210

[56] References Cited

U.S. PATENT DOCUMENTS 4,521,476  6/1985  Asai et al. ........................... 428/209

Primary Examiner—Patrick J. Ryan
Assistant Examiner—Cathy K. Lee
Attorney, Agent, or Firm—Cushman, Darby & Cushman

[57] ABSTRACT

A substrate on which a protected conductive layer is formed. The conductive layer is formed by laminating together different kinds of conductive metal layers. A lowermost conductive metal layer of the conductive metal layers is formed on an insulating surface of a substrate body. A restraining structure contacts at least two conductive metal layers of the conductive metal layers. The restraining structure restrains elution of the conductive metal to prevent parts of the conductive metal from being eroded.

11 Claims, 5 Drawing Sheets

SUBSTRATE HAVING A MULTIPLE METAL PROTECTED CONDUCTIVE LAYER AND METHOD OF MANUFACTURING THE SAME

BACKGROUND OF THE INVENTION

1. Field of the Invention

The present invention relates to a substrate having a conductive layer thereon and a method of manufacturing such a substrate. The conductive layer is formed by laminating different kinds of conductive metal layers, and has a predetermined shape. The present invention can be effectively adopted to, for example, a metal substrate for a hybrid integrated circuit (IC).

2. Description of the Related Art

A conventional metal substrate for a hybrid IC in which an electric circuit pattern is formed on an insulating layer has been known. The metal substrate is formed by the following process. First the insulating layer of resin and then a conductive metal layer formed of a plurality of sublayers are formed on a metal plate. The metal layer is then etched to form the pattern.

Such a substrate uses a laminated body formed by laminating different kinds of conductive metal sublayers as the metal layer, one of the sublayers is of a material to improve an electric conductivity, and a thermal conductivity, and another is of a material to improve a wire bonding characteristics. An example of such a laminated body is disclosed in, for example, U.S. Pat. No. 4,521,476.

The laminated body is formed, for example, as shown in FIG. 8(a). Namely, a zinc (Zn) layer is formed on rolled aluminum foil by a substitution plating method. A copper (Cu) layer is then formed on the zinc layer by an electroplating method. Thus, the laminated body has an Al-Zn-Cu structure. The copper layer is bonded to an insulating layer. According to this structure, electric conductivity and thermal conductivity of the laminated body are improved because of the copper layer, and wire bonding characteristic to the laminated body is also improved because of the aluminum foil.

However, when a hybrid IC substrate having the above-mentioned laminated body has been operated in a damp atmosphere for a long time, some of the metal existing at the contact portion between the laminated metal layers becomes eluted. "Eluted" means that a part of the metal is actually lost so that the structure becomes as shown in FIG. 8(b), with the Zn being shorter than the other metals. It is believed that this is caused by a water film being formed on a surface of the laminated body, and the specific metal being ionized due to the potential difference between the laminated metal layers. For example, in the laminated body shown in FIG. 8(a), zinc is ionized, and the ionized zinc becomes as shown in FIG. 8(b). Therefore, the upper layer of aluminum foil more easily comes off the copper layer, because the zinc layer, which bonds the aluminum foil to the copper layer, is decreased in size.

Generally speaking, a larger difference between ionization tendencies of the conductive metal layers contacting each other will cause more metal to be eluted. Moreover, the eluted metal is the metal has a larger ionization tendency. In the laminated body shown in FIG. 8(a), the difference between ionization tendencies of copper and zinc is larger than between zinc and aluminum, and a stable alumina ($Al_2O_3$) layer has been formed on the surface of the aluminum foil. Therefore, aluminum which has the largest ionization tendency among these metals is not eluted, and instead zinc is eluted.

The elution length L (shown in FIG. 8(b)) increases over time. Especially when the insulating layer is a resin layer, such as an epoxy layer, the elution length L becomes long, because is that chlorine ions ($Cl-$) exist as free ions in the resin layer and they change the water film into an electrolytic water solution film.

SUMMARY OF THE INVENTION

Accordingly, it is an objective of the present invention to provide a substrate having a conductive layer thereon and a method of manufacturing such a substrate, wherein the conductive layer is formed by laminating different kinds of conductive metal layers and where the above-mentioned elution of the conductive metal is restrained.

To accomplish the foregoing and other objects and in accordance with the purpose of the present invention, a substrate has a conductive layer. The conductive layer is formed of at least two different kinds of conductive metal sublayers. A lowermost conductive metal sublayer of the conductive metal sublayers is formed on an insulating surface of a substrate body. A restraining means contacts the two conductive metal sublayers of the conductive metal sublayers. The restraining means restrains elution of conductive metal.

In a preferred embodiment, a protective layer is formed as the restraining means on side of the conductive layer to protect contact portion between the conductive metal sublayers from air.

When the protective layer is formed, it is possible to prevent the conductive metal from being eluted from the conductive layer.

In another preferred embodiment, an alloy layer is formed as the restraining means between the conductive metal sublayers. The alloy layer is made of at least two kinds of metals which are included in the conductive metal sublayers.

When the alloy layer is formed, it is possible to restrain the conductive metal from being eluted from the conductive layer, because the difference between ionization tendencies of the alloy layer and the conductive metal sublayer is smaller than that of the conductive metal sublayers, and the alloy layer is more stable than a simple metal layer.

In a method of manufacturing a substrate, a substrate body having an insulating surface is first prepared. A conductive layer is then formed on the insulating surface. The conductive layer has been formed of at least two different kinds of conductive metal sublayers. A restraining means is then formed. The restraining means contacts the two conductive metal sublayers of the conductive metal sublayers. The restraining means retrains elution of conductive metal.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments together with the accompanying drawings in which:

DESCRIPTION OF THE PREFERRED EMBODIMENTS

The preferred embodiments of the present invention will now be described with reference to the drawings.

Figure 1:
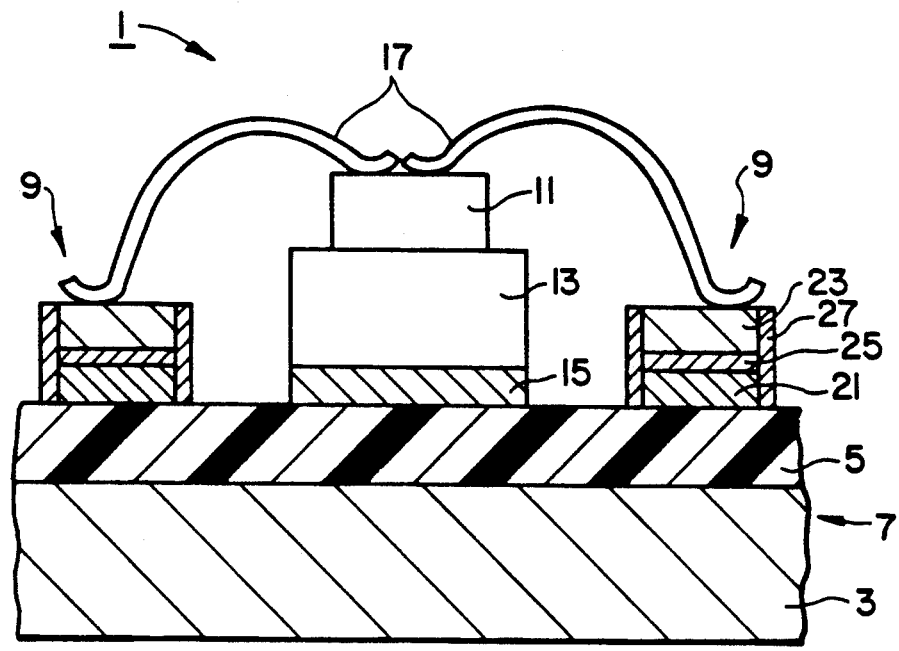
FIG. 1 is a cross-sectional view of a metal substrate according to an embodiment.
Figure 2:
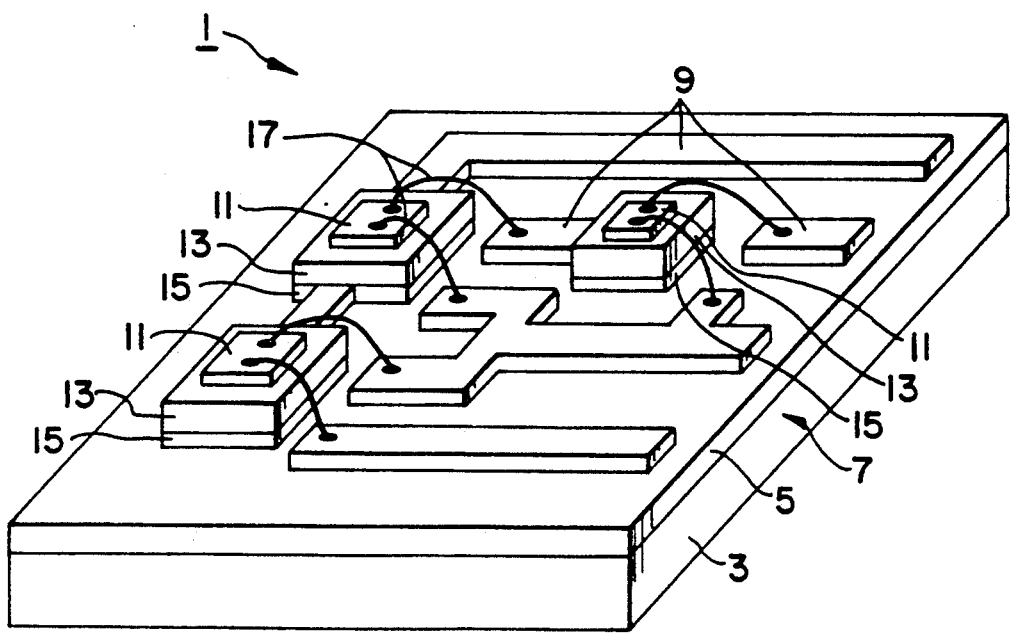
FIG. 2 is a perspective view of the metal substrate.

FIGS. 1 and 2 show a metal substrate 1 according to the present embodiment has a substrate body 7, a conductive layer 9 and an installing part 15. The substrate body 7 is composed of an aluminum substrate 3 and an insulating resin layer 5 laminated on the aluminum substrate 3. The conductive layer 9 is laminated on the insulating resin layer 5 as an electric circuit pattern. The installing part 15 is made of copper foil which has good electric conductivity and good thermal conductivity. The installing part 15 is also laminated on the insulating resin layer 5 and installs circuit parts 11, which is a device such as a power transistor or a transistor for multiplying a small signal, thereon through a heat spreader 13 by soldering. Terminals bf the circuit parts 11 and the conductive layer 9 are electrically connected with each other by aluminum wires 17. Thus, an electric circuit is formed.

The conductive layer 9 is composed of a laminated body in which a zinc layer 25 and an aluminum layer 23 are laminated on a copper layer 21 in this order. The copper layer 21 has good electric conductivity and good thermal conductivity. The aluminum layer 23 enables the aluminum wires 17 to bond thereto more easily. The zinc layer 25 bonds the copper layer 21 to the aluminum layer 23. The conductive layer 9 is installed on the insulating resin layer 5 by laminating the copper layer 21 on the insulating resin layer 5. A protective layer 27 is provided on the sides 98 of the conductive layer 9 in order to protect the contact portion between the copper layer 21 and the zinc layer 25 and the contact portion between the zinc layer 25 and the aluminum layer 23 from air. The protective layer 27 is made of nickel (Ni).

Figure 3A:
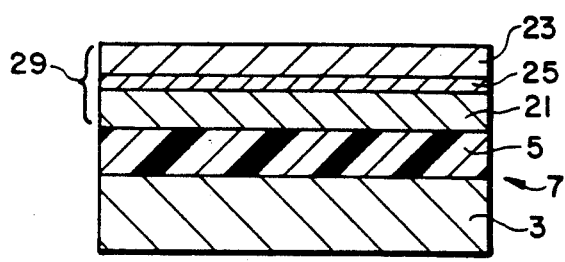
FIGS. 3(a) to 3(f) are cross-sectional views for explaining the manufacturing process for the metal substrate.

The process of manufacturing the above-mentioned metal substrate 1 of the embodiment of the present invention will be described with reference to FIGS. 3(a)-3(f). The FIGS. 3(a)-3(f) show the sequence of the process. The process begins with rolled aluminum foil 23 having a thickness of 40 μm. A zinc layer 25 is formed on the rolled aluminum foil by a substitution plating method. The zinc layer 25 has a thickness of approximately 100 A. A copper layer 21 is then formed on the zinc layer by an electroplating method. The copper layer has a thickness of 85 μm. Thus, metal foil 29 composed of the copper layer 21, the zinc layer 25 and the aluminum layer 23 is formed. The metal foil 29 is laminated on the insulating resin layer 5 by bonding the copper layer 21 to the insulating resin layer 5. The bonding process is carried out by heat treatment, wherein the metal foil 29 is pressed on the substrate body 7, and the metal foil 29 and the substrate body 7 are heated at 120° C. for an hour. FIG. 3(a) shows the metal foil 29 laminated on the substrate body 7.

Figure 3B:
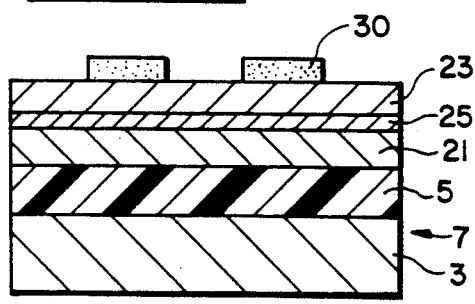

A photoresist layer 30 is screen-printed on the aluminum layer 23 as an etching resist. The photoresist layer 30 is then selectively photoetched so that a predetermined circuit pattern is covered as shown in FIG. 3(b).

Figure 3C:
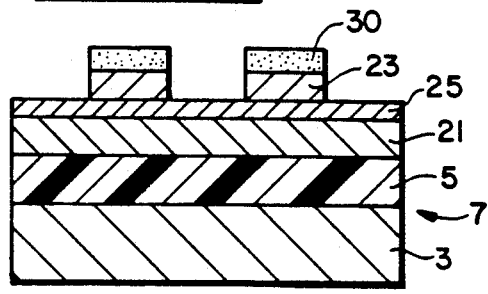
Figure 3D:
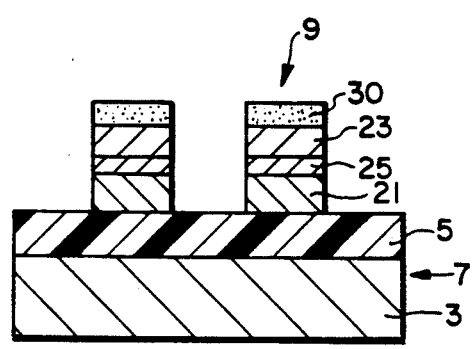

Thereafter, as shown in FIGS. 3(c) and 3(d), the metal foil 29 is etched by predetermined etchant using the photoresist layer 30 as a mask so that the conductive layer 9 is formed. The pattern of the conductive layer 9 corresponds to that of the photoresist. A mixed solution in which caustic soda (100 g/l) and nitric soda (2 g/l) are mixed is utilized in the process shown in FIG. 3(c). The aluminum layer 23 is etched by the mixed solution at 50° C. for three minutes. A solution of ammonium persulfate (150 g/l) is utilized in the process shown in FIG. 3(d). The zinc layer 25 and the copper layer 21 are etched by the solution at 50° C. for two minutes.

Figure 3E:
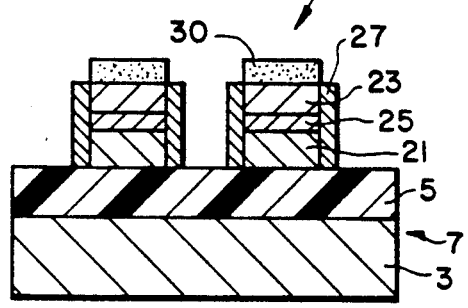

After the metal foil 29 is etched, the protective layer 27 made of nickel is provided on the sides 98 of the conductive layer 9 as shown in FIG. 3(e). The protective layer 27 is formed by an electroless plating method.

Figure 3F:
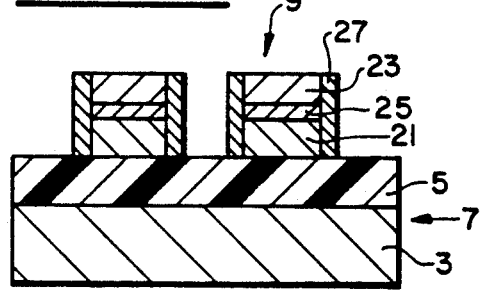

Thereafter, the photoresist layer 30 is stripped. FIG. 3(f) shows the metal substrate 1 manufactured by the above-mentioned process.

It is noted that, when nickel-plating is carried out to form the protective layer 27, the photoresist layer 30 remains on the aluminum layer 23. Therefore, it is possible to easily form the protective layer 27 on the side 98 of the conductive layer 9 by the following steps.

Namely, the side 98 of the conductive layer 9 is first dewaxed and cleaned by a weakly acidic solution (for example, OPC clean produced by Okuno Chemical Industries Co., Ltd.) at room temperature for approximately one minute. An oxide formed on the side 98 of the conductive layer 9 is then removed by an oxide-removal solution (For example, a solution including 10% sulfuric acid by volume) at room temperature for approximately thirty seconds. A zinc-plating layer is formed by a substitution plating method using a solution for zinc-substitution (For example, SUBSTAR ZN-2 produced by Okuno Chemical Industries Co., LTD.) at room temperature for approximately forty seconds to form a nickel-plating layer on the side of the conductive layer 9. Then the nickel-plating layer, i.e., the protective layer 27 is formed by a solution for nickel-plating (For example, Solution made up of Top Nicoron RD-M and RD-1 produced by Okuno Chemical Industries Co., LTD.) at 88° C. for approximately thirty-five minutes. According to the above-mentioned process, the protective layer 27 having a thickness of 5 μm is formed. The present embodiment further carries out chromate treatment at 45° C. for fifteen minutes to improve the moistureproof characteristic, wherein sodium bichromate is used.

As explained above, according to the metal substrate 1 of the present embodiment, the conductive layer 9 is composed of a laminated body in which the zinc layer 25 and the aluminum layer 23 have been laminated on the copper layer 21 in this order. Moreover, a protective layer 27 made of nickel is formed on the side 98 of the conductive layer 9. Therefore, the conductive layer 9 has good electric conductivity, good thermal conductivity and good bonding characteristics. Moreover, it is possible to prevent zinc from being eluted from the conductive layer 9, even if the metal substrate is in operation for a long time.

Figure 4:
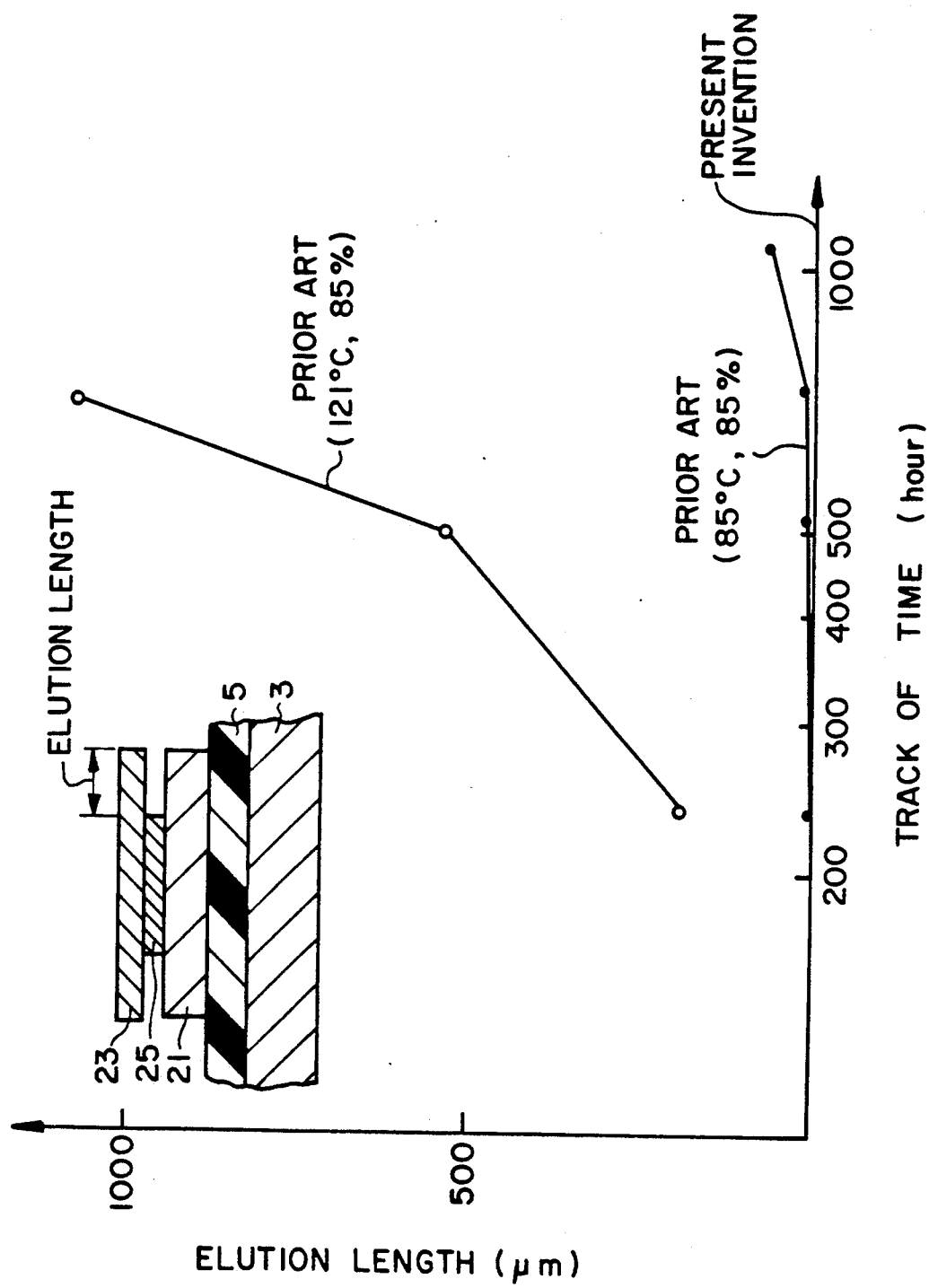
FIG. 4 is a graph showing a relationship between track of time and an elution length.

It has been confirmed by the following life test that the protective layer 27 prevents zinc from being eluted. Before the test, the metal substrate having the protective layer 27 was manufactured by the manufacturing process shown in FIGS. 3(a)-3(f). A metal substrate not having the protective layer 27 was also manufactured by the manufacturing process shown in FIGS. 3(a)-3(d) and 3(f), namely, in which the process shown in FIG. 3(e) was omitted. The life test for these metal substrates was carried out by a pressure cooker test. The metal substrate, in which the conductive layer having a width of 1 mm and a length of 15 mm was laminated on the substrate body one inch square, was used in this life test. The thickness of each layer composing the conductive layer was the same as that of each layer of the above-mentioned embodiment. Consequently, as shown in FIG. 4, zinc was eluted in the metal substrate not having the protective layer 27 both in an atmosphere having a temperature of 85° C. and a humidity of 85% and in an atmosphere having a temperature of 121° C. and humidity of 85%. Moreover, higher temperatures caused, a longer elution length L of zinc. In contrast, zinc was not eluted in the metal substrate having the protective layer 27 in any atmosphere.

Moreover, according to the present embodiment, the etching process of the zinc layer 25 and the copper layer 21 shown in FIG. 3(d) is followed by the nickel-plating process shown in FIG. 3(e) to form the protective layer 27. Therefore, it is possible to easily form the metal substrate 1 by adding only one process, i.e., the nickel-plating process, to the conventional manufacturing process of the substrate not having the protective layer 27.

Figure 5:
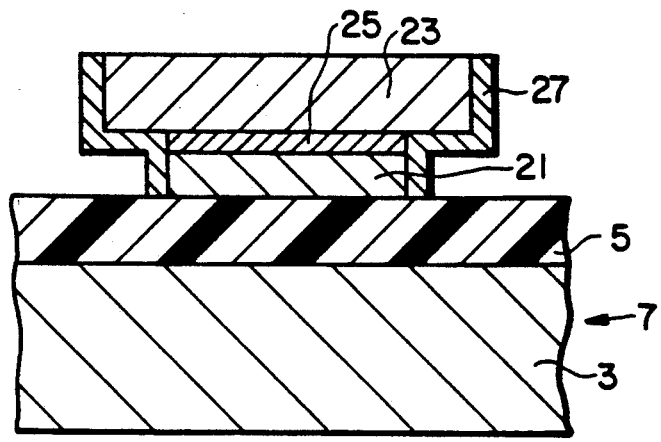
FIG. 5 is a cross-sectional view of a metal substrate having a mushroom-shaped conductive layer.
Figure 6A:
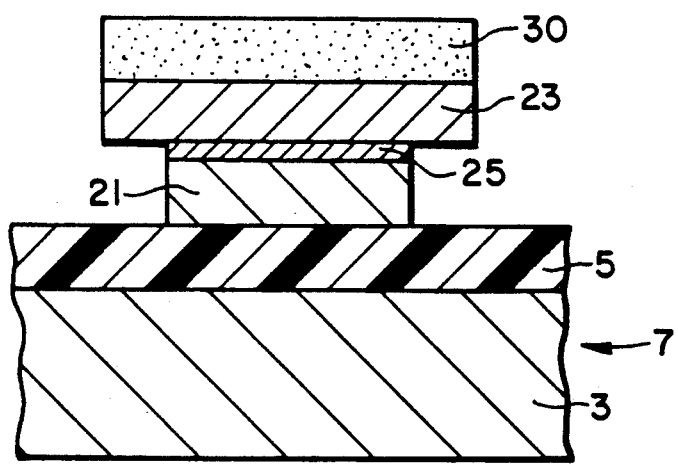
FIG. 6(a) and 6(b) are cross-sectional views for explaining the manufacturing process of a metal substrate which uses a mushroom-shaped conductive layer as an interim product, and removes it for the final product.

When the zinc layer 25 and the copper layer 21 are etched in the process shown in FIG. 3(d), the conductive layer 9 may be shaped like a mushroom because the width of the zinc layer 25 and the copper layer 21 becomes narrower than that of the aluminum layer 23 due to the side-etching of the zinc layer 25 and the copper layer 21. This mushroom-shape is shown in FIG. 6(a) in the conventional substrate not having the protective layer 27, when the conductive layer 9 is shaped like a mushroom by side-etching, water film easily collects under the cap of the mushroom shaped conductive layer 9. Therefore, the elution of zinc is promoted. According to the present embodiment, because the protective layer 27 is formed by a plating method, the protective layer 27 is satisfactorily formed even under the cap as shown in FIG. 5. Therefore, it is possible to prevent zinc from being eluted even if the conductive layer 9 is shaped like a mushroom.

Figure 6B:
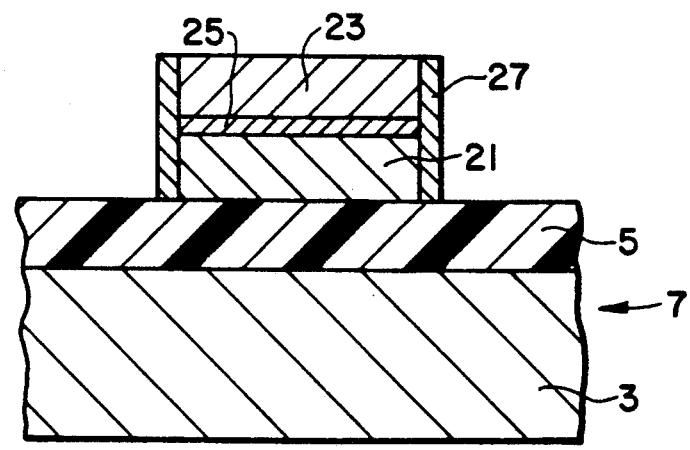

After the zinc layer 25 and the copper layer 21 are etched in the process shown in FIG. 3(d), the aluminum layer 23 may be etched again by the same process as the process shown in FIG. 3(c) in order to remove the cap of the mushroom-shaped conductive layer 9 shown in FIG. 6(a). If the conductive layer 9 is done like this way, it will have no cap at all, as shown in FIG. 6(b).

In the above-mentioned embodiment, the protective layer 27 is formed by plating of nickel, but it can be formed by plating of another metal, such as copper (Cu), gold (Au), other than nickel. Moreover, the protective layer 27 can be formed by a method other than plating. For example, a polymer, such as polyimide or epoxy, may be formed on the side of the conductive layer 9 by a spin coat method in the process shown in FIG. 3(e). The polymer used must be one that has moistureproof characteristic and low viscosity. After the polymer is formed, the photoresist layer 30 is stripped. Furthermore, the protective layer 27 can be formed while the conductive layer 9 is etched by using selective etchant.

Figure 7:
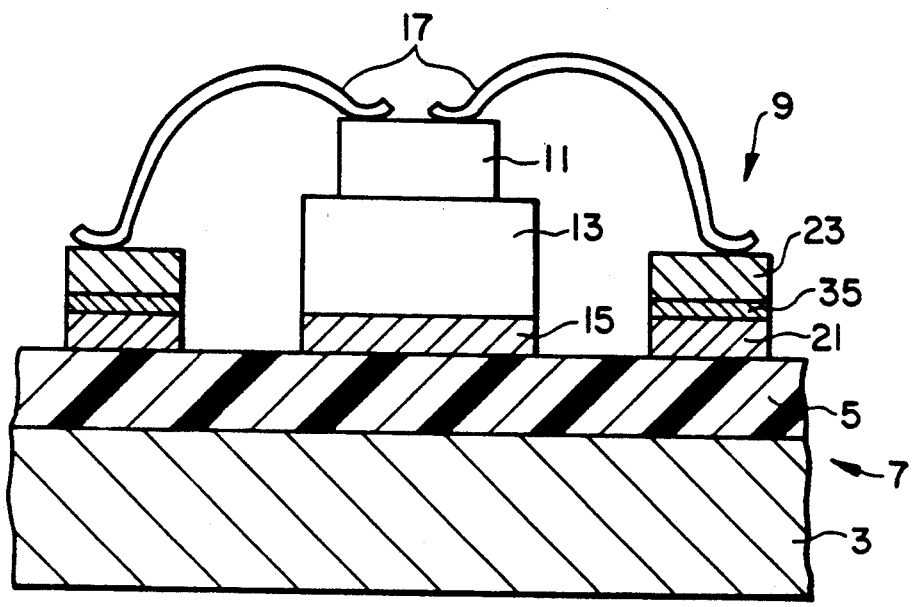
FIG. 7 is a cross-sectional view of a metal substrate according to another embodiment.
Figure 8A:
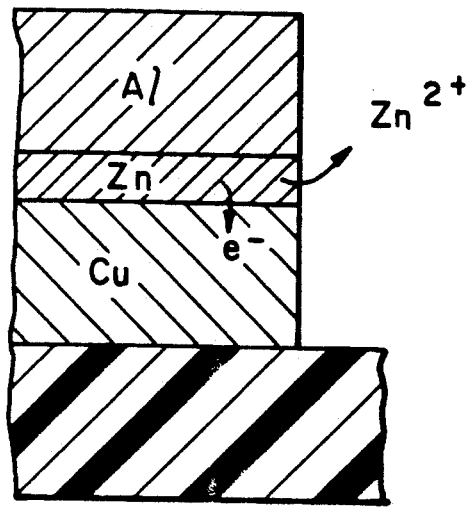
FIGS. 8(a) and 8(b) are cross-sectional views for explaining the elution phenomenon of a conductive metal in the conventional metal substrate.
Figure 8B:
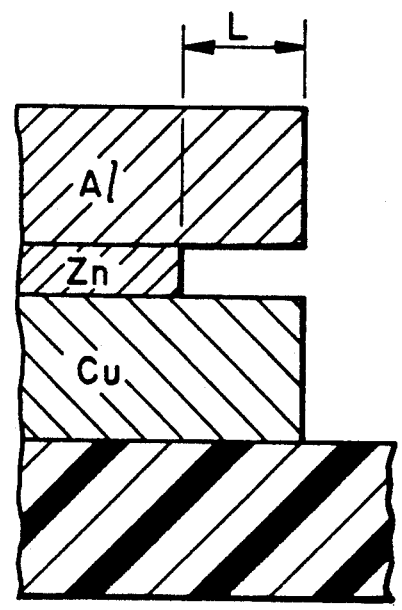

Although the embodiment in which the protective layer 27 is formed on the side of the conductive layer 9 to prevent zinc from being eluted, has been described above, the protective layer 27 is not necessarily formed on the side to restrain zinc from being eluted. FIG. 7 shows a second embodiment in which an alloy layer 35 of copper, zinc and aluminum is formed between the copper layer 21 and the aluminum layer 23 without using the protective layer 27. In this case, the difference between ionization tendencies of the alloy layer 35 and the copper layer 21 and the difference between ionization tendencies of the alloy layer 35 and the aluminum layer 23 are smaller than that of the copper layer 21 and the zinc layer 25 and that of the zinc layer 25 and the aluminum layer 23. Moreover, it is more difficult for the alloy layer 35 to be eluted than for the zinc layer 25 of the prior art. Therefore, the elution of the metal existing at contact portions is restrained.

The manufacturing process of the alloy layer 35 is as follows. After the process shown in FIG. 3(d), the conductive layer 9 is heated at 350° C. for 15-30 minutes. The alloy layer 35 is formed by mutually diffusing zinc, copper and aluminum during the heat treatment. It is noted that no drastic change in the manufacturing process is necessary because the alloy layer 35 is formed by adding the heat treatment of the conventional manufacturing process. When the insulating resin layer 5 is made of epoxy resin, the insulating resin layer 5 changes its color by reacting with the epoxy resin with air during the heat treatment is carried out in the air. Therefore, it is desirable to carry out the heat treatment in, for example, nitrogen gas.

Although this invention is described above by the embodiments thereof, it is not restricted thereto, since it is apparent that this invention can have many variables, including those enumerated below:

(1) In the above-mentioned embodiments, the conductive layer 9 is composed of the laminated body having the copper layer 21, the zinc layer 23 and the aluminum layer 25. However, the conductive layer 9 may be composed of a laminated body other than the above-mentioned laminated body. For example, the conductive layer in which a copper layer has been laminated on an alloy layer of iron (Fe) and nickel may be utilized. The conductive layer in which an alloy layer of iron and nickel has been laminated on an aluminum layer may be also utilized. The conductive layer in which a copper layer has been laminated on an aluminum layer may also be utilized. It is noted that an example of such a conductive layer may be found in U.S. Pat. No. 4,521,476, issued on Jun. 4, 1985, which is incorporated herein by reference. Even if such a conductive layer is utilized, it is possible to restrain the elution of metal by forming the protective layer on the side of the conductive layer or by forming an alloy layer between metal layers.

(2) An insulating substrate may be utilized in place of the above-mentioned substrate body 7 in which the insulating resin layer 5 is laminated on the aluminum substrate 3.

What is claimed is:

1. A substrate having a conductive layer, which comprises:
   a substrate body having an insulating surface;
   a conductive layer comprising at least two kinds of conductive metal sublayers of materials selected from the group consisting of zinc, aluminum, copper and alloys thereof, laminated together, a first surface of said conductive layer being formed on said insulating surface, and said conductive layer having sides which extend from said first surface to a second top surface thereof; and
   a protective layer which restrains said conductive layer from ionizing and eluting, said protective layer being formed on said sides of said conductive layer to protect contact portions between said conductive metal sublayers.

2. A substrate having a conductive layer according to claim 1 further comprising a wire bonded to an uppermost conductive metal sublayer of said conductive metal sublayers.

3. A substrate having a conductive layer according to claim 1, wherein said insulating surface is a surface of an insulating resin layer.

4. A substrate having a conductive layer according to claim 1, wherein said protective layer is an alloy layer of at least two kinds of metals from the group consisting of zinc, aluminum and copper, said alloy layer is formed between said conductive metal layers.

5. A substrate having a conductive layer, which comprises:
   a substrate body having an insulating surface;
   a conductive layer formed by laminating different kinds of conductive metal layers of materials selected from the group consisting of zinc, aluminum, copper and alloys thereof, including a lowermost conductive metal layer of a first material which is formed on said insulating surface and other metal layers of other materials, other than said first material, said first material having higher electric conductivity and thermal conductivity than said other metal layers, said conductive metal layer having sides extending between contact portions between the layers;
   a protective layer formed on at least one of said sides of said conductive layer to protect said contact portions between said conductive metal layers from elution; and
   a wire bonded to an uppermost conductive metal layer of said conductive metal layers.

6. A substrate having a conductive layer, which comprises:
   a substrate body having an insulating surface;
   a conductive layer formed by laminating different kinds of conductive metal layers of materials selected from the group consisting of zinc, aluminum, copper and alloys thereof, including a lowermost conductive metal layers which is formed on said insulating surface, said conductive metal layer having sides extending between contact portions between the layers;
   a protective layer formed on at least one of said sides of said conductive layer to protect said contact portions between said conductive metal layers from elution; and
   a wire bonded to an uppermost conductive metal layer of said conductive metal layers.

7. A substrate having a conductive layer, which comprises:
   a substrate body having an insulating surface; and
   a conductive layer formed by laminating at least three different kinds of conductive metal sublayers of materials selected from the group consisting of zinc, aluminum, copper and alloys thereof, said three conductive metal sublayers including a lower conductive metal sublayer, an alloy layer and an upper conductive metal sublayer, said lower conductive metal sublayer being formed on said insulating surface, said alloy layer being formed of at least two kinds of metals including at least a metal of said lower conductive metal sublayer and a metal of said upper conductive metal sublayer, and said alloy layer being formed between said lower and upper conductive metal sublayers.

8. A substrate having a conductive layer according to claim 1, wherein said conductive sublayer includes three laminated conductive metal layers.

9. A substrate having a conductive layer according to claim 8, wherein a first of said conductive metal sublayers is a copper layer, a second of said conductive sublayers is a zinc layer, and a third of said conductive sublayers is an aluminum layer, said zinc layer being laminated between said copper layer and said aluminum layer.

10. A substrate having a conductive layer, which comprises:
    a substrate body having an insulating surface;
    a conductive layer formed by laminating at least three conductive metal layers of materials selected from the group consisting of zinc, aluminum, copper and alloys thereof, said three conductive metal layers including a lower conductive metal layer, an alloy layer and an upper conductive metal layer, said lower conductive metal layer being formed on said insulating surface, said alloy layer being made of at least two kinds of metals which are included in said conductive metal layers, and said alloy layer being formed between said conductive metal layers;
    a protective layer formed on at least one of said sides of said conductive layer to protect said contact portions between said conductive metal layers from elution; and
    a wire bonded to said upper conductive metal layer.

11. A substrate having a conductive layer, which comprises:
    a substrate body having an insulating surface;
    a conductive layer comprising at least two conductive metal sublayers laminated together, an ionization tendency of a first of said layers being different in value than an ionization tendency of a second of said layers, one of said conductive metal sublayers being capable of ionizing and eluting due to a potential difference between said conductive metal sublayers, a first surface of said conductive layer being formed on said insulating surface, and said conductive layer having sides which extend from said first surface to a second top surface thereof; and
    a protective layer which restrains said conductive layer from ionizing and eluting, said protective layer being formed on said sides of said conductive layer to protect contact portions between said conductive metal sublayers.

* * * * *